(12) United States Patent
Sun

(10) Patent No.: US 8,300,418 B2
(45) Date of Patent: Oct. 30, 2012

(54) ELECTRONIC DEVICE WITH FIXING MEMBER FOR MOUNTING FLEXIBLE PRINTED CIRCUIT BOARD

(75) Inventor: Zheng-Heng Sun, Taipei-Hsien (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 243 days.

(21) Appl. No.: 12/852,599

(22) Filed: Aug. 9, 2010

(65) Prior Publication Data

US 2011/0317379 A1     Dec. 29, 2011

(51) Int. Cl.
*H05K 5/00* (2006.01)

(52) U.S. Cl. ........................................................ 361/759

(58) Field of Classification Search .................. 361/759, 361/679.32, 679.33, 679.37, 679.38, 679.39, 361/679.58, 740, 726; 439/325
See application file for complete search history.

(56) References Cited

U.S. PATENT DOCUMENTS

2005/0059285 A1* 3/2005 Chen et al. ..................... 439/325
2007/0232127 A1* 10/2007 Lin .............................. 439/492

\* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

An electronic device includes a chassis, a motherboard installed in the chassis, a fixing member, and a flexible printed circuit board electronically coupled to the motherboard. The chassis forms two hooks adjacent to the motherboard. The fixing member includes a plate resisting against the flexible printed circuit board, and two legs extending down from the plate. Two latches extend from the corresponding legs to engage with the corresponding hooks.

7 Claims, 3 Drawing Sheets

ELECTRONIC DEVICE WITH FIXING MEMBER FOR MOUNTING FLEXIBLE PRINTED CIRCUIT BOARD

BACKGROUND

1. Technical Field

The present disclosure relates to electronic devices and, particularly, to an electronic device mounted with a flexible printed circuit board.

2. Description of Related Art

Many flexible printed circuit boards are electronically engaged with connectors mounted on motherboards. However, connectors usually don't have a fixing member to fix the flexible printed circuit boards which may then disengage from the connector due to vibrations of the server. As a result, fixing members are needed to fix flexible printed circuit boards.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
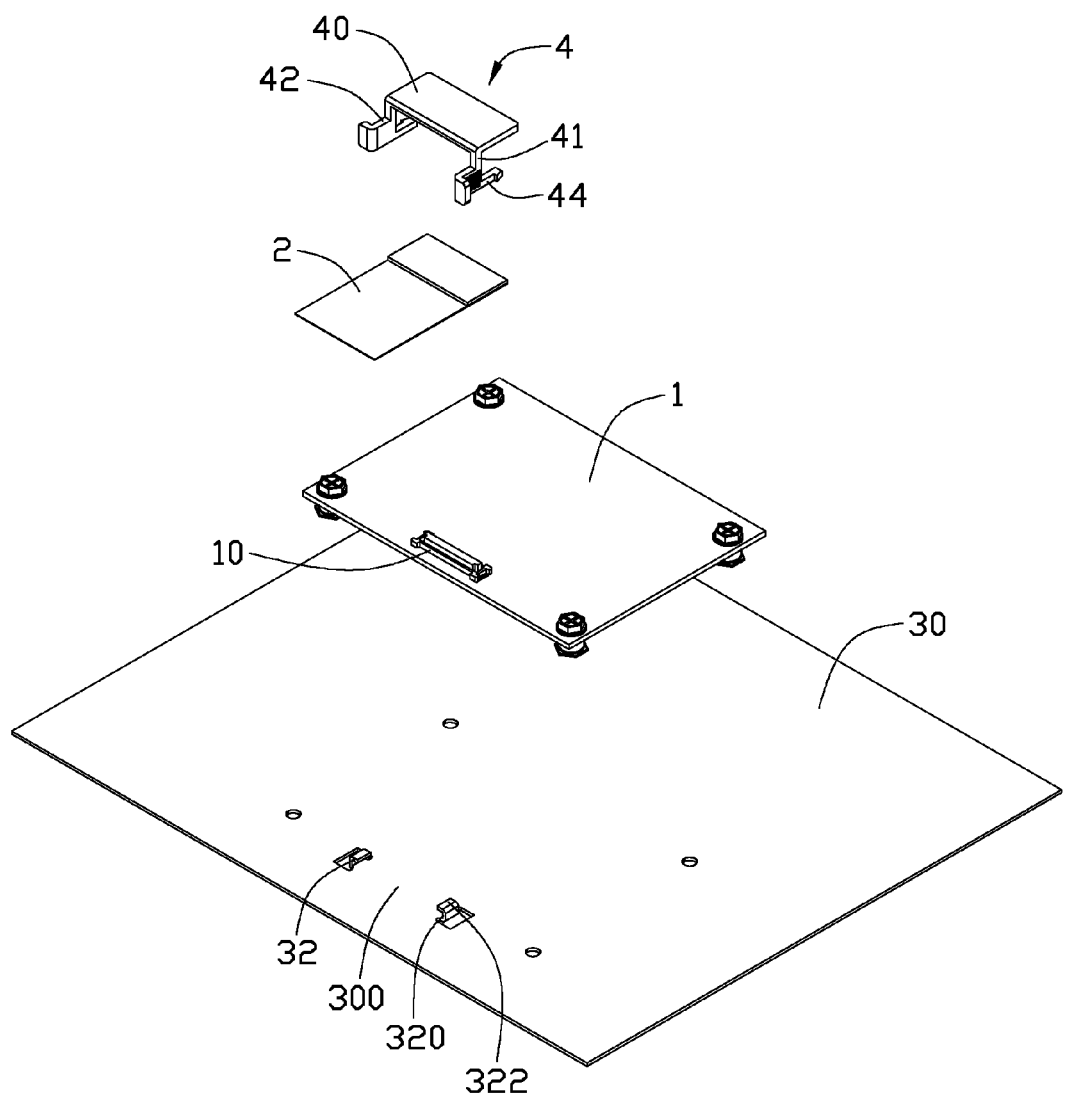
FIG. 1 is an exploded, isometric view of an exemplary embodiment of an electronic device.
Figure 2:
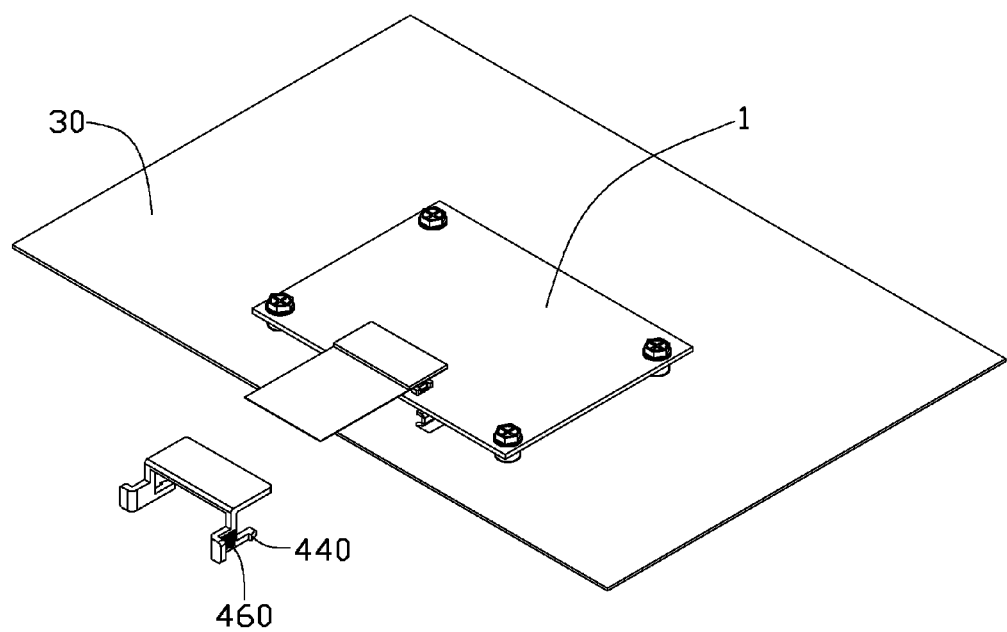
FIG. 2 is a partly assembled, isometric view of the electronic device of FIG. 1.

Referring to FIG. 1 and FIG. 2, an exemplary embodiment of an electronic device includes a chassis, a motherboard 1 installed in the chassis, a fixing member 4, and a flexible printed circuit board 2 electronically coupled to the motherboard 1.

The motherboard 1 is installed in a sidewall 30 of the chassis, a connector 10 is mounted on a rear end of the motherboard 1, and the circuit board 2 is engaged with the connector 10.

Two L-shaped hooks 32 extend from the sidewall 30 facing toward each other to define a sliding channel 300 therebetween. Each of the hooks 32 has a first portion 320 extending up from the sidewall 30 and a second portion 322 extending inward from a top of the first portion 320.

The fixing member 4 includes a plate 40, two legs 41 perpendicularly extending from opposite ends of a rear side of the plate 40, two L-shaped operating members 42 perpendicularly extending rearward from the legs 41, respectively; and two latches 44 perpendicularly extending forward from the legs 41, respectively. A wedge-shaped protrusion 440 is formed on a distal end of each latch 44 and extends away from the other latch 44. An antiskid portion 460 is formed on each operating member 42, for convenient manual operation of the fixing member 4.

Figure 3:
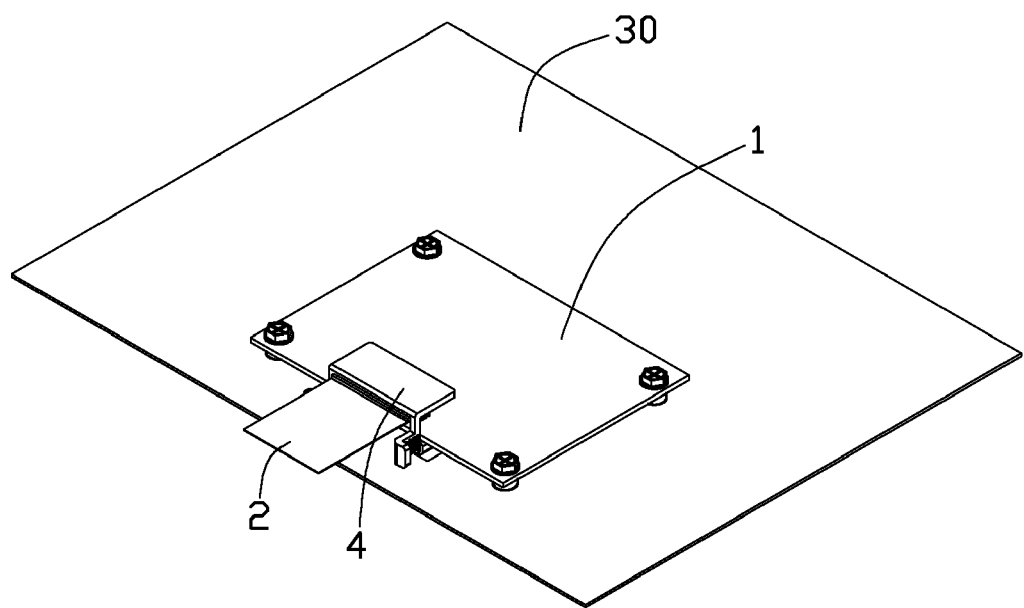
FIG. 3 is an assembled, isometric view of the electronic device of FIG. 1.

Referring to FIG. 3, in assembly, the circuit board 2 is coupled to the connector 10 of the motherboard 1. The antiskid portions 460 of the operating members 42 are pressed towards each other to deform the latches 44. The latches 44 extend through the sliding channel of the sidewall 30, with the protrusions 440 being squeezed by the first portions 320 of the hooks, and upper edges of the latches 44 being restricted by the second portions 322 of the hooks 32, and then the protrusions 440 are restored and snappingly engaged with front edges of the hooks 32. The plate 40 resists against the circuit board 2 to confirm connection between the circuit board 2 and the motherboard 1.

In disassembling the circuit board 2 from the motherboard 1, the antiskid portions 460 are pressed towards each other to disengage the protrusions 440 of the latches 44 from the corresponding hooks 32. The fixing member 4 is moved backward to be removed, and then the circuit board 2 can be easily moved from the connector 10.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. An electronic device, comprising:
   a chassis comprising a sidewall, two L-shaped hooks extending from the sidewall and facing toward each other to define a sliding channel therebetween, wherein each of the hooks has a first portion extending up from the sidewall and a second portion extending inward from a top of the first portion;
   a motherboard mounted on the sidewall;
   a flexible printed circuit board electronically coupled to the motherboard; and
   a fixing member comprising a plate, two legs extending down from opposite ends of the plate, two latches respectively extending forward from the legs, and two protrusions extending away from each other respectively from free ends of the latches;
   wherein the latches are operable of being deformed to slide forward through the sliding channel, with the protrusions being squeezed by the first portions of the hooks, and upper edges of the latches being restricted by the second portions of the hooks, and then the protrusions are restored to respectively engage with front edges of the hooks, thereby the plate resists against the flexible printed circuit board opposite to the motherboard.

2. The electronic device of claim 1, wherein an operating member extends from each leg away from the corresponding latches for operating the latch to deform.

3. The electronic device of claim 2, wherein an antiskid portion is formed on each operating member.

4. The electronic device of claim 1, wherein each operating member is L-shaped.

5. An electronic device comprising:
   a chassis comprising a sidewall, two L-shaped hooks extending from the sidewall and facing toward each other to define a sliding channel therebetween, wherein each of the hooks has a first portion extending up from the sidewall and a second portion extending inward from a top of the first portion;
   a motherboard mounted on the sidewall;
   a flexible printed circuit board electronically coupled to the motherboard; and a fixing member comprising two legs, a plate extending forward from tops of the legs, two latches respectively extending forward from bottoms of the legs, and two protrusions extending outward from free ends of the latches respectively;

wherein the latches are operable of being deformed to slide forward through the sliding channel, with the protrusions squeezed by the first portions of the hooks and upper edges of the latches restricted by the second portions of the hooks, and then the protrusions are restored to respectively engage with front edges of the hooks, thereby the plate resists against the flexible printed circuit board to confirm connection between the flexible printed circuit board and the motherboard.

6. The electronic device of claim 5, wherein the hooks are located under the motherboard, and after the latches engage with the hooks, the plate and the latches sandwich the motherboard and the flexible printed circuit therebetween.

7. The electronic device of claim 5, wherein two L-shaped operating members extends rearward from bottoms of the legs respectively for manual operation.

\* \* \* \* \*